US012694936B2

(12) United States Patent
Zhang et al.

(10) Patent No.: US 12,694,936 B2
(45) Date of Patent: Jul. 28, 2026

(54) CURRENT BIAS CIRCUIT, MEMORY DEVICE AND MEMORY SYSTEM

(71) Applicant: Yangtze Memory Technologies Co., Ltd., Wuhan (CN)

(72) Inventors: Xinyue Zhang, Wuhan (CN); Ruxin Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 188 days.

(21) Appl. No.: 18/442,040

(22) Filed: Feb. 14, 2024

(65) Prior Publication Data
US 2025/0104780 A1 Mar. 27, 2025

Related U.S. Application Data

(63) Continuation of application No. PCT/CN2023/122302, filed on Sep. 27, 2023.

(51) Int. Cl.
*G11C 16/30* (2006.01)
*G05F 1/575* (2006.01)
*G05F 1/59* (2006.01)
*G11C 16/04* (2006.01)

(52) U.S. Cl.
CPC .............. *G11C 16/30* (2013.01); *G05F 1/575* (2013.01); *G05F 1/59* (2013.01); *G11C 16/0483* (2013.01)

(58) Field of Classification Search
CPC ..... G11C 16/0483; G11C 16/30; G05F 1/575; G05F 1/59
See application file for complete search history.

(56) References Cited

U.S. PATENT DOCUMENTS 6,456,557 B1 * 9/2002 Dadashev .............. G11C 16/30
365/185.09
8,897,070 B2 * 11/2014 Dong ................. G11C 16/0483
365/185.17
10,243,526 B1 * 3/2019 Cical ................... H03F 3/45475
(Continued)

FOREIGN PATENT DOCUMENTS

CN 109658957 A 4/2019
CN 110166011 8/2019
(Continued)

OTHER PUBLICATIONS

International Search Report and Written Opinion in International Appln. No. PCT/CN2023/122302, mailed on Nov. 22, 2023, 11 pages (with partial English translation).
(Continued)

*Primary Examiner* — Khamdan N. Alrobaie
(74) *Attorney, Agent, or Firm* — Fish & Richardson P.C.

(57) ABSTRACT

Examples of the present disclosure disclose a current bias circuit, a memory device and a memory system. The current bias circuit includes: a voltage stabilizing circuit configured to output a second voltage through a second terminal of the voltage stabilizing circuit based on a first voltage received by a first terminal of the voltage stabilizing circuit; and a main circuit coupled to the second terminal of the voltage stabilizing circuit at a first terminal of the main circuit, and configured to receive the second voltage output by the second terminal of the voltage stabilizing circuit to generate a bias current.

20 Claims, 8 Drawing Sheets

(56) References Cited

U.S. PATENT DOCUMENTS

| | | | |
|---|---|---|---|
| 2008/0094920 A1* | 4/2008 | Hsu ........................ | G11C 5/143 |
| | | | 365/189.09 |
| 2009/0261800 A1 | 10/2009 | Pan | |
| 2017/0110197 A1 | 4/2017 | Park et al. | |
| 2018/0284830 A1* | 10/2018 | Yung ......................... | G05F 1/66 |
| 2021/0382512 A1* | 12/2021 | Chang ..................... | G05F 1/573 |
| 2022/0051701 A1* | 2/2022 | Cheon .................. | G11C 13/004 |
| 2022/0091623 A1* | 3/2022 | Dyer ..................... | G05F 1/5735 |

FOREIGN PATENT DOCUMENTS

| | | |
|---|---|---|
| CN | 111601429 A | 8/2020 |
| CN | 113345492 | 9/2021 |
| CN | 116185124 A | 5/2023 |
| CN | 116774771 A | 9/2023 |

OTHER PUBLICATIONS

Office Action in Korean Appln. No. 10-2025-7032166, mailed on Feb. 4, 2026, 12 pages (with English translation).

* cited by examiner

PSR of a LDO and a voltage stabilizing circuit at different frequencies

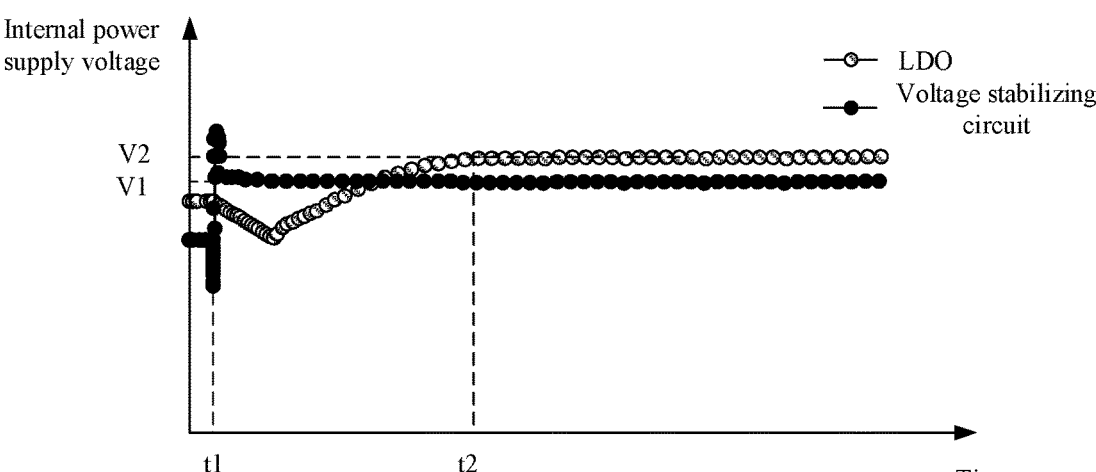
Response speed of a LDO and a voltage stabilizing circuit to generate a stable internal power supply voltage
FIG. 2C
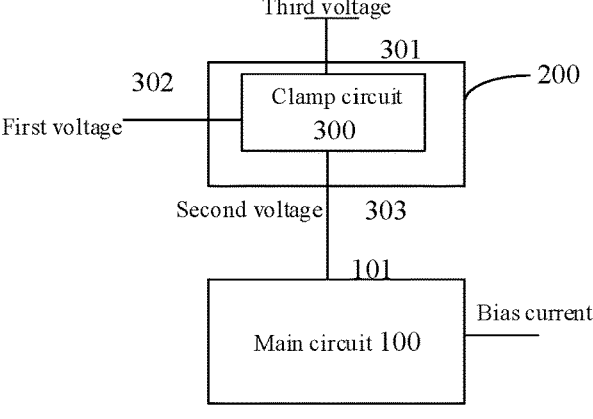
FIG. 3
FIG. 4

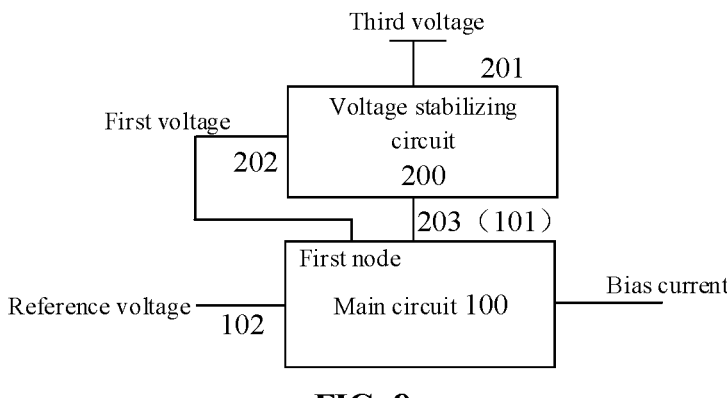
FIG. 8
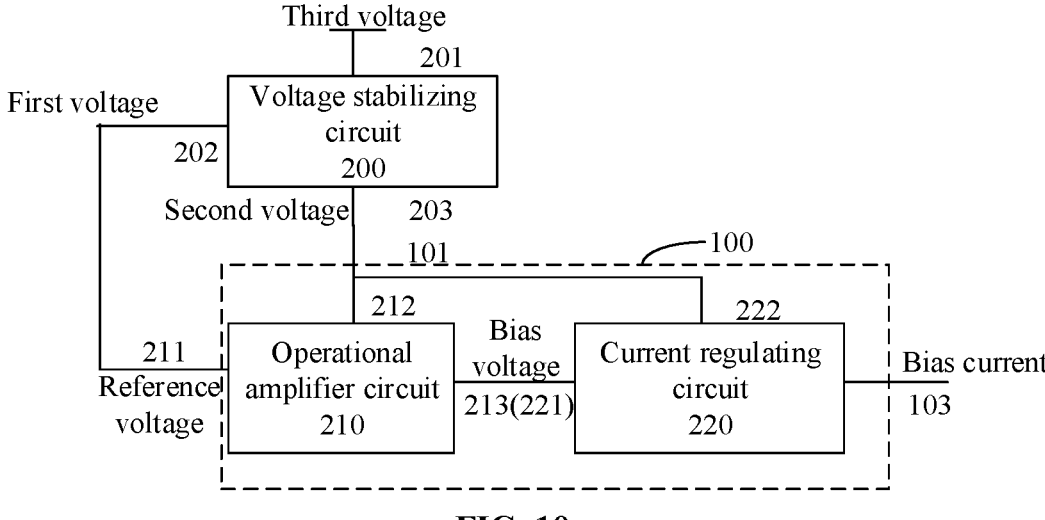
FIG. 9
FIG. 10a

60

700

CURRENT BIAS CIRCUIT, MEMORY DEVICE AND MEMORY SYSTEM

CROSS-REFERENCE TO RELATED APPLICATIONS

This application is a continuation of International Application No. PCT/CN2023/122302, filed on Sep. 27, 2023, the disclosure of which is hereby incorporated by reference in its entirety.

TECHNICAL FIELD

Examples of the present disclosure relate to semiconductor technologies, and relates to, but not limited to, a current bias circuit, a memory device and a memory system.

BACKGROUND

A memory chip is an essential part of a modern electronic apparatus. The memory chip can not only improve storage capability of the apparatus, but also enable an electronic apparatus to be more intelligent. How to improve the performance of the memory chip has become an urgent problem to be solved.

SUMMARY

In the light of this, examples of the present disclosure provide a current bias circuit, a memory device and a memory system.

In a first aspect, examples of the present disclosure provide a current bias circuit, comprising:

a voltage stabilizing circuit configured to output a second voltage through a second terminal of the voltage stabilizing circuit based on a first voltage received by a first terminal of the voltage stabilizing circuit; and a main circuit, wherein a first terminal of the main circuit is coupled to the second terminal of the voltage stabilizing circuit, and the main circuit is configured to receive the second voltage output by the second terminal of the voltage stabilizing circuit to generate a bias current.

In some examples, the voltage stabilizing circuit comprises a clamp circuit, and the clamp circuit is configured to provide the second voltage to the first terminal of the main circuit based on the first voltage and a voltage drop of the clamp circuit.

In some examples, the clamp circuit comprises a first transistor, and is configured to provide the second voltage to the first terminal of the main circuit based on the first voltage and a threshold voltage of the first transistor.

In some examples, a third terminal of the voltage stabilizing circuit is configured to receive a third voltage that is greater than the first voltage.

In some examples, the first transistor comprises a depletion N-type transistor.

In some examples, the voltage stabilizing circuit further comprises a first resistor coupled to the clamp circuit.

In some examples, a resistance value of the first resistor is related to magnitude of loss in loop stability caused by parasitic capacitance of the voltage stabilizing circuit.

In some examples, the resistance value of the first resistor is greater than or equal to 1 kΩ, and less than or equal to 100 kΩ.

In some examples, the main circuit is configured to provide the first voltage to the first terminal of the voltage stabilizing circuit based on a reference voltage received by a second terminal of the main circuit.

In some examples, the main circuit is configured to generate a feedback voltage at a first node of the main circuit based on the reference voltage received by the second terminal of the main circuit, wherein the feedback voltage is equal to the reference voltage; and the first node of the main circuit is connected to the first terminal of the voltage stabilizing circuit.

In some examples, the main circuit comprises:

an operational amplifier circuit, wherein a first terminal of the operational amplifier circuit is configured to receive the reference voltage, and provide a bias voltage to a current regulating circuit; and the current regulating circuit coupled to the operational amplifier circuit and configured to output the bias current from a first terminal of the current regulating circuit based on the bias voltage and the second voltage.

In some examples, the first terminal of the voltage stabilizing circuit is connected to a second terminal of the operational amplifier circuit; or the first terminal of the voltage stabilizing circuit is connected to a feedback terminal of the operational amplifier circuit.

In some examples, the operational amplifier circuit comprises a first P-type transistor, a second P-type transistor, a first N-type transistor, a second N-type transistor, a third N-type transistor, a third P-type transistor and a second resistor;

a gate terminal of the first P-type transistor is connected to a gate terminal of the second P-type transistor; a first terminal of the first P-type transistor, a first terminal of the second P-type transistor and a first terminal of the third P-type transistor are connected to the second terminal of the voltage stabilizing circuit; the gate terminal of the second P-type transistor is connected to a second terminal of the second P-type transistor; a first terminal of the first N-type transistor, a second terminal of the first P-type transistor and a gate terminal of the third P-type transistor are connected to a second terminal of the current regulating circuit; a first terminal of the second N-type transistor is connected to the second terminal of the second P-type transistor; a gate terminal of the first N-type transistor is configured to receive the reference voltage; a gate terminal of the second N-type transistor and a first terminal of the second resistor are connected to a second terminal of the third P-type transistor; a second terminal of the second resistor is connected to a ground terminal; a second terminal of the first N-type transistor and a second terminal of the second N-type transistor are connected to a first terminal of the third N-type transistor; and a second terminal of the third N-type transistor is connected to the ground terminal.

In some examples, the current regulating circuit comprises a second transistor;

a first terminal of the second transistor is connected to the second terminal of the voltage stabilizing circuit, a gate terminal of the second transistor is connected to an output terminal of the operational amplifier circuit, and a second terminal of the second transistor is configured to output the bias current.

In a second aspect, examples of the present disclosure provide a memory device, comprising a memory cell array and a peripheral circuit coupled with the memory cell array, wherein the peripheral circuit comprises a current bias circuit of any one of the above examples.

In a third aspect, examples of the present disclosure further provide a memory device, comprising a memory cell array and a peripheral circuit coupled with the memory cell array, wherein the peripheral circuit comprises:

a first transistor configured to output a second voltage through a first terminal of the first transistor based on a first voltage received by a gate terminal of the first transistor; and a main circuit, wherein a first terminal of the main circuit is coupled to the first terminal of the first transistor, and the main circuit is configured to generate a bias current based on the second voltage output by the first terminal of the first transistor.

In some examples, the peripheral circuit further comprises a first resistor, wherein a first terminal of the first resistor is connected to a gate terminal of the first transistor.

In some examples, the first transistor comprises a depletion N-type transistor.

In some examples, a second terminal of the main circuit is configured to receive a reference voltage, the main circuit is configured to generate a feedback voltage at a first node of the main circuit based on the reference voltage, wherein the feedback voltage is equal to the reference voltage; and a second terminal of the first resistor is connected to the first node of the main circuit.

In some examples, the main circuit comprises a first P-type transistor, a second P-type transistor, a first N-type transistor, a second N-type transistor, a third P-type transistor, a second resistor and a second transistor;

a gate terminal of the first P-type transistor is connected to a gate terminal of the second P-type transistor; a first terminal of the first P-type transistor, a first terminal of the second P-type transistor, a first terminal of the third P-type transistor and a first terminal of the second transistor are connected to the first terminal of the first transistor; the gate terminal of the second P-type transistor is connected to a second terminal of the second P-type transistor; a first terminal of the first N-type transistor, a second terminal of the first P-type transistor and a gate terminal of the third P-type transistor are connected to a gate terminal of the second transistor; a first terminal of the second N-type transistor is connected to the second terminal of the second P-type transistor; a gate terminal of the first N-type transistor is configured to receive a reference voltage; a gate terminal of the second N-type transistor and a first terminal of the second resistor are connected to a second terminal of the third P-type transistor; a second terminal of the second resistor is connected to a ground terminal; a second terminal of the first N-type transistor and a second terminal of the second N-type transistor are connected to the ground terminal; and a second terminal of the second transistor outputs the bias current.

In some examples, the gate terminal of the first N-type transistor is connected to the gate terminal of the first transistor, or the gate terminal of the second N-type transistor is connected to the gate terminal of the first transistor.

In a fourth aspect, examples of the present disclosure provide a memory system comprising: a memory device of any one of the above examples, and a memory controller that is coupled with the memory device and controls the memory device.

In the examples of the present disclosure, the voltage stabilizing circuit is disposed at the first terminal of the main circuit, the first terminal of the voltage stabilizing circuit receives the first voltage, and the second terminal of the voltage stabilizing circuit outputs the second voltage. In a first aspect, the second voltage output by the second terminal of the voltage stabilizing circuit is related to the magnitude of the first voltage and internal characteristics of the voltage stabilizing circuit, so the impact of power supply noise in external power supply can be effectively filtered out, and the power supply rejection capability of the bias current generation circuit is improved, such that the bias current generated by the main circuit is more stable. In a second aspect, the solution provided by the examples of the present disclosure utilizes the clamp circuit to supply power, such that the second voltage stabilizes at a faster speed, which can meet the speed requirement of a high-speed circuit. In a third aspect, there is no need for a large number of decoupling capacitors and extra high performance in the examples of the present disclosure, and the area of the voltage stabilizing circuit is small, which is beneficial to miniaturization of the memory.

BRIEF DESCRIPTION OF THE DRAWINGS

In the drawings, like reference numerals may describe like components in different views. Like reference numerals having different letter suffixes may represent different examples of like components. The drawings illustrate generally, by way of example, but not by way of limitation, various examples as discussed herein.

FIG. 2C is a schematic diagram of a response speed of an LDO and a voltage stabilizing circuit to generate a stable internal power supply voltage;

FIGS. 3 to 12 are schematic diagrams of a current bias circuit provided by still further examples of the present disclosure;

DETAILED DESCRIPTION

Figure 1:
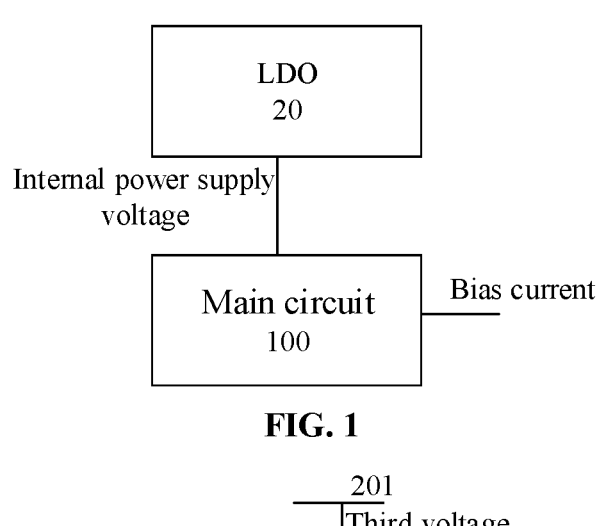
FIG. 1 is a schematic diagram of a current bias circuit provided in some examples of the present disclosure.

In order to facilitate the understanding of the present disclosure, the present disclosure will be described below more comprehensively with reference to the relevant drawings. Examples of the present disclosure are given in the drawings. However, the present disclosure may be implemented in many different forms, and is not limited to the examples described herein. Instead, the purpose of providing these examples is to make the disclosed content of the present disclosure more thorough and comprehensive.

Unless otherwise defined, all technical and scientific terms used herein have the same meanings as those generally understood by those skilled in the art. The terms used in the specification of the present disclosure are only for the purpose of describing specific examples, and are not intended to limit the present disclosure. The term "and/or" used herein include any and all combinations of one or more listed associated items.

A memory chip is an essential part of a modern electronic apparatus. The memory chip can not only improve storage capability of the apparatus, but also enable an electronic apparatus to be more intelligent. With continuous progress of science and technology, the memory chip is also updated continuously, higher and higher requirements are imposed on a speed of an input/output (I/O) system of the memory chip, and in turn, higher and higher requirements are imposed on a speed of an I/O buffer in the memory chip. The I/O buffer needs a bias current to meet the speed requirement of the I/O system, and the generation speed of the bias current is required to be fast. At the same time, since the bias current will affect a duty cycle of the I/O system, in order to ensure the duty cycle of the I/O system, the bias current is also required to be stable, so as to have good power supply rejection (PSR) capability. The bias current may be finally used as an input voltage of the I/O system through current-voltage conversion.

Therefore, how to ensure that the bias current provided in the memory chip has both a fast generation speed and good power supply rejection capability becomes an urgent problem to be solved.

In some examples, a main circuit receives an internal power supply voltage and is configured to generate the bias current. In some examples, as shown in FIG. 1, the internal power supply voltage received by the main circuit 100 is supplied by a high-performance low dropout regulator (LDO) 20 that is used to filter out noise in an external power supply to ensure cleanness of voltage. However, the power supply rejection capability of the LDO 20 becomes poor at a high frequency, which will affect the bias current generated by the main circuit 100 in this case. Moreover, due to the long response time of the LDO 20, the turn-on speed of the bias current cannot meet the specification requirements of Open NAND Flash Interface (ONFI); and an area occupied by the LDO 20 is large, which is unfavorable to the miniaturization of the chip. In some other examples, a large number of decoupling capacitors may be also added to help turn on the main circuit 100 and filter out noise in the external power supply, but the large number of decoupling capacitors require occupying a large area of the memory device, which is unfavorable to the miniaturization of the memory device.

Figure 2A:
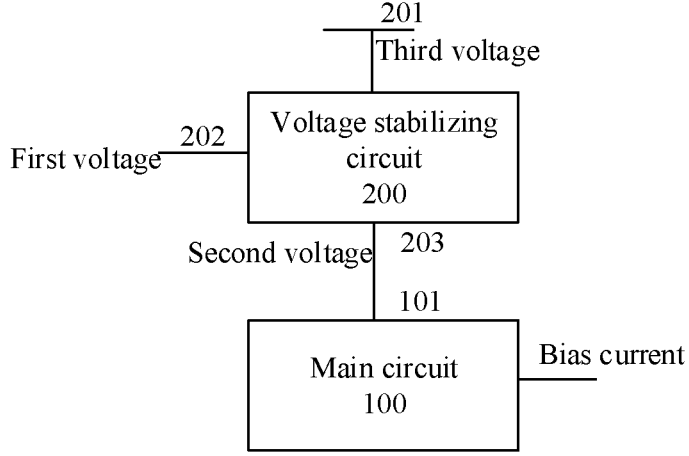
FIG. 2A is a schematic diagram of a current bias circuit provided in some other examples of the present disclosure.

In order to solve one or more of the above problems, examples of the present disclosure provide a current bias circuit which, as shown in FIG. 2A, comprises:

a voltage stabilizing circuit 200 configured to output a second voltage through a second terminal 203 of the voltage stabilizing circuit 200 based on a first voltage received by a first terminal 202 of the voltage stabilizing circuit 200; and a main circuit 100, wherein a first terminal 101 of the main circuit 100 is coupled to the second terminal 203 of the voltage stabilizing circuit 200, and the main circuit 100 is configured to receive the second voltage output by the second terminal 203 of the voltage stabilizing circuit 200 to generate a bias current.

In the examples of the present disclosure, the first voltage may be from the main circuit 100 or from other external circuits. It is to be noted that, the external circuit generating the first voltage is also a part of the memory device.

In the examples of the present disclosure, a third terminal of the voltage stabilizing circuit is further configured to receive a third voltage which may be generated by an external power supply. The external power supply will generate a power supply noise in a switching state or during power supplying. It is to be noted that, the external power supply generating the third voltage is also a part of the memory device.

It may be understood that if the third voltage is directly provided to the main circuit 100, the output bias current will not be stable when there is power supply noise in the third voltage. In the examples of the present disclosure, the voltage stabilizing circuit 200 is disposed at the first terminal 101 of the main circuit, the third terminal 201 of the voltage stabilizing circuit receives the third voltage, and the first terminal 202 of the voltage stabilizing circuit receives the first voltage. In a first aspect, the second voltage output by the second terminal 203 of the voltage stabilizing circuit is related to the magnitude of the first voltage and internal characteristics of the voltage stabilizing circuit 200, and is unrelated to interference and state to which the third voltage is subjected; therefore, an influence of the power supply noise in the external power supply can be effectively filtered out, and the power supply rejection capability of a bias current generation circuit is improved, such that the bias current generated by the main circuit 100 is more stable. In a second aspect, the solution provided by the examples of the present disclosure utilizes a clamp circuit to supply power, such that the second voltage is stabilized at a faster speed, which can meet the speed requirements of the high-speed circuit. In a third aspect, the area of the voltage stabilizing circuit is small, thus it does not occupy a large area of the memory device, which is beneficial to the miniaturization of the memory device.

Figure 2B:
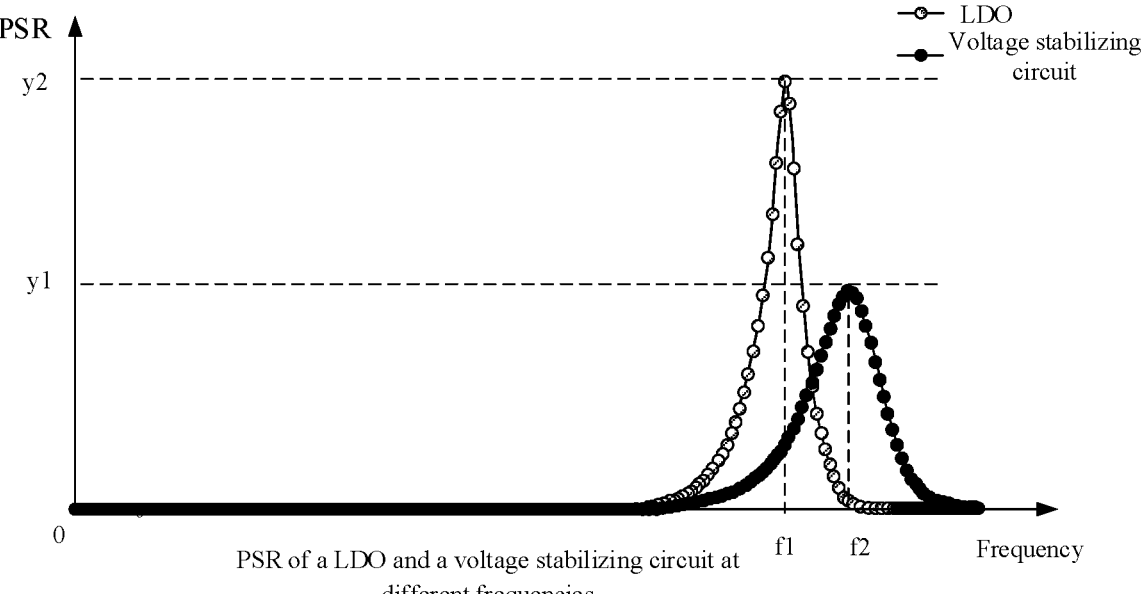
FIG. 2B is a schematic diagram of PSR of an LDO and a voltage stabilizing circuit at different frequencies.

FIG. 2B shows PSR at different frequencies in the case where the LDO and the voltage stabilizing circuit supply power to the main circuit (a hollow circle line represents that the power is supplied by the LDO, and a solid circle line represents that the power is supplied by the voltage stabilizing circuit provided by the examples of the present disclosure).

As can be seen from FIG. 2B, the highest value of the PSR is generated when the LDO supplies power to the main circuit. The higher the value of the PSR is, the poorer the noise filtering capability of the circuit is.

For the LDO circuit, the highest value of the PSR occurs at a high frequency f1, and the value of the PSR is y2. For the voltage stabilizing circuit, the highest value of the PSR occurs at a high frequency f2, and the value of the PSR is y1, wherein y1 is obviously less than y2.

FIG. 2B also shows that both power supply circuits perform well at low and medium frequencies. FIG. 2C shows that a response speed of generating a stable second voltage in the case where the LDO and the voltage stabilizing circuit supplies power to the main circuit (a hollow circle line represents that the power is supplied by the LDO, and a solid circle line represents that the power is supplied by the voltage stabilizing circuit provided by the examples of the present disclosure).

As can be seen, when the LDO supplies power to the main circuit, the response speed of the second voltage is t2, while in the case where the voltage stabilizing circuit provided by the examples of the present disclosure supplies power to the main circuit, the response speed of the second voltage is t1, where the response speed is accelerated greatly. In FIG. 2C, both V1 and V2 are voltages meeting the requirements of the main circuit.

In some examples, as shown in FIG. 3, the voltage stabilizing circuit 200 comprises a clamp circuit 300 that is configured to provide the second voltage to the first terminal 101 of the main circuit based on the first voltage and a voltage drop of the clamp circuit 300.

A first terminal 301 of the clamp circuit is configured to receive the third voltage, a second terminal 302 of the clamp circuit is configured to receive the first voltage, and an output terminal 303 of the clamp circuit is connected to the first terminal 101 of the main circuit. The voltage drop of the clamp circuit 300 refers to a voltage difference between a voltage received and a voltage output by the clamp circuit 300, and a value of the voltage difference is determined by internal device characteristics of the clamp circuit 300.

The clamp circuit 300 may achieve positive clamping or negative clamping functions. In an example, the clamp circuit 300 may shift the received first voltage upward or downward, without changing a waveform of the first voltage.

In the examples of the present disclosure, since the first voltage is a stable voltage, the second voltage generated by shifting the stable voltage upward or downward is also a stable voltage.

It is to be noted that, the second voltage needs to be greater than the voltage margin required by the main circuit 100. The main circuit 100 comprises a plurality of transistors.

The second voltage needs to ensure that the plurality of transistors included in the main circuit 100 work in the normal operation range and maintain a certain voltage margin. Here, the reason of maintaining a certain voltage margin is to ensure that the main circuit 100 can operate normally under process conditions of different temperatures.

In some examples, as shown in FIG. 4, the clamp circuit 300 comprises a first transistor 400, and is configured to provide the second voltage to the first terminal 101 of the main circuit based on the first voltage and a threshold voltage of the first transistor 400.

In the examples of the present disclosure, the second voltage is mainly determined by the first voltage and the threshold voltage of the first transistor 400, thereby filtering out the power supply noise on the external power supply. Moreover, the area of the memory chip occupied by the first transistor 400 is reduced greatly as compared with the large number of decoupling capacitors, which effectively saves the area of the memory chip and is beneficial to the miniaturization of the memory chip.

In some examples, the third terminal 201 of the voltage stabilizing circuit is configured to receive the third voltage, wherein the first voltage is less than the third voltage.

In the examples of the present disclosure, the above third voltage may be generated by the external power supply. The external power supply will generate the power supply noise in the switching state or during power supplying.

It may be understood that, if the first voltage received by a gate terminal of the first transistor 400 is greater than the third voltage received by a second terminal of the first transistor 400, which means the first transistor 400 is fully turned on, the third voltage received by the second terminal of the first transistor 400 may be completely transmitted to a first terminal of the first transistor 400, and in this case, a voltage at the first terminal of the first transistor 400 is still equal to the third voltage. Hence, a good clamping effect cannot be achieved. The first voltage is less than the third voltage in order to ensure the first transistor 400 is in a just turned-on state. In this case, the clamping effect can be achieved by the first transistor 400, and a voltage at the second terminal of the first transistor 400 is equal to the first voltage minus the threshold voltage of the first transistor 400.

In some examples, the first transistor 400 comprises an enhanced N-type transistor.

When the first transistor 400 is an enhanced N-type transistor, the second voltage is equal to the first voltage minus a threshold voltage of the enhanced transistor, while the threshold voltage of the enhanced transistor is greater than 0, so the second voltage is equal to the first voltage minus the threshold voltage of the enhanced transistor.

In some examples, the first transistor 400 comprises a depletion N-type transistor.

When the first transistor 400 is a depletion N-type transistor, the second voltage is equal to the first voltage minus a threshold voltage of the depletion transistor, while the threshold voltage of the depletion transistor is less than 0, so the second voltage is equal to the first voltage plus an absolute value of the threshold voltage of the depletion transistor. Since the second voltage needs to be greater than a voltage margin required by the main circuit 100, the use of the depletion N-type transistor is more beneficial to raise the second voltage, such that the magnitude of the second voltage meets actual voltage requirements and the requirements of normal operation of the circuit.

In the examples of the present disclosure, the second voltage is determined by the first voltage and the threshold voltage of the first transistor 400, thereby filtering out the power supply noise on the external power supply. Moreover, the area of the memory chip occupied by the first transistor 400 is very small, which effectively saves the area of the memory chip and is beneficial to the miniaturization of the memory chip.

Figure 5:
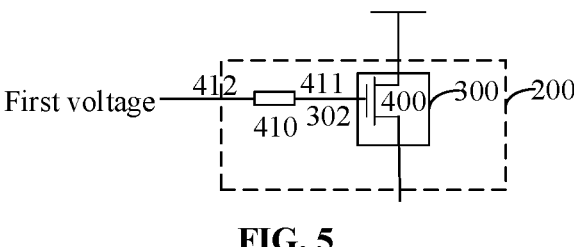

In some examples, as shown in FIG. 5, the voltage stabilizing circuit 200 further comprises a first resistor 410 that is coupled to the clamp circuit 300. In an example, a first terminal 411 of the first resistor is connected to the second terminal 302 of the clamp circuit 300, and a second terminal 412 of the first resistor is configured to receive the first voltage.

In some examples, a resistance value of the first resistor 410 is related to the magnitude of loss in loop stability caused by parasitic capacitance of the voltage stabilizing circuit 200.

It may be understood that, the parasitic capacitance may also exist in the clamp circuit 300. In an example, the clamp circuit 300 comprises the first transistor 400, and the parasitic capacitance Cgs may also exist between the first terminal of the first transistor 400 and the gate terminal of the first transistor 400, and it will result in loss in loop stability. The loop stability refers to that a pole is introduced due to the parasitic capacitance Cgs. This pole is pushed far away by adding a zero through adding the first resistor 410, thereby ensuring the loop stability. Here, the magnitude of the parasitic capacitance Cgs is related to the process and dimension of the first transistor 400.

According to the examples of the present disclosure, the first resistor 410 is disposed at the second terminal 302 of the clamp circuit, which compensates loss in loop stability caused by the parasitic capacitance Cgs and improves the stability of the circuit.

In some examples, the resistance value of the first resistor 410 is greater than or equal to 1 kΩ, and less than or equal to 100 kΩ.

It is to be noted that, the specific range of the resistance value of the first resistor 410 given above is just an example, and is not used to limit the resistance value of the first resistor 410. In some examples, the resistance value of the first resistor 410 may be accordingly set according to the magnitude of loss in loop stability caused by the parasitic capacitance.

Figure 6:
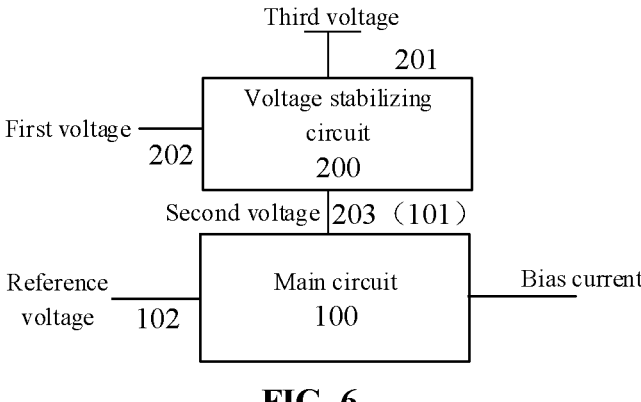
Figure 7:
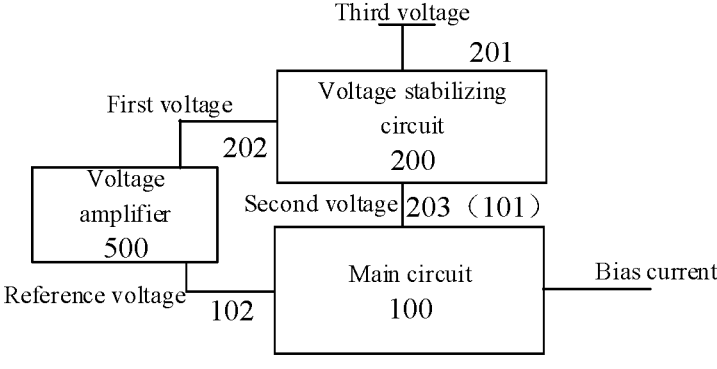

In some examples, as shown in FIGS. 6 and 7, the main circuit 100 is configured to provide the first voltage to the first terminal 202 of the voltage stabilizing circuit 200 based on the reference voltage received by the second terminal 102 of the main circuit 100.

In some examples, as shown in FIG. 6, the second terminal 102 of the main circuit 100 receives the reference voltage, and outputs the bias current based on the reference voltage. The main circuit 100 is configured to provide the first voltage to the voltage stabilizing circuit 200 based on the reference voltage. In the examples of the present disclosure, the first voltage is provided by the second terminal 102 of the main circuit 100 without an additional first voltage generation circuit to generate the first voltage, which effectively utilizes existing resources, saves the cost, and is more beneficial to the miniaturization of the memory chip.

In some examples, the second terminal 102 of the main circuit 100 may be connected to a reference voltage source that provides the reference voltage to the second terminal 102 of the main circuit 100.

In some examples, the reference voltage source may be a bandgap reference in the memory device. The reference voltage may be a reference voltage in the memory device.

In some examples, as shown in FIG. 7, the reference voltage may be directly provided to the second terminal 102 of the main circuit, the reference voltage is indirectly provided to the voltage stabilizing circuit through a voltage amplifier 500, the first voltage is equal to k times the reference voltage, and K is an amplification factor of the voltage amplifier 500. That is, the first voltage may be obtained from the reference voltage by scaling in a certain proportion. When the reference voltage is small, a larger first voltage, for example, 1.2 times of the reference voltage, may be obtained by increasing the amplification factor K. When the reference voltage is large, a smaller first voltage, for example, 0.8 times of the reference voltage, may be obtained by decreasing the amplification factor K.

In the examples of the present disclosure, the voltage amplifier 500 is added to regulate the magnitude of the first voltage, such that the first voltage is more flexible and can be applicable to more types of the main circuit 100.

In some examples, as shown in FIG. 8, the main circuit 100 is configured to generate a feedback voltage at a first node of the main circuit 100 based on the reference voltage received by the second terminal 102 of the main circuit, wherein the feedback voltage is equal to the reference voltage; and the first node of the main circuit 100 is connected to the first terminal 202 of the voltage stabilizing circuit.

In the examples of the present disclosure, the first node of the main circuit 100 is connected to the first terminal 202 of the voltage stabilizing circuit, which can effectively avoid the influence of the switching state of the high-speed main circuit 100 (switch in the main circuit 100 is not shown) on the second terminal 102 of the main circuit. After the circuit is stabilized, the feedback voltage of the first node of the main circuit 100 may be equal to the reference voltage of the second terminal 102 of the main circuit. Here, the first node of the main circuit may be an internal node of the main circuit. It is to be noted that, due to the reasons such as coupling capacitance inside the main circuit or internal voltage fluctuations of the main circuit caused by external interference, etc., the feedback voltage here is not necessarily completely equal to the reference voltage, but is approximately equal to the reference voltage. In an ideal case, the feedback voltage is equal to the reference voltage.

It may be understood that, the first node of the main circuit is connected (including directly connected and indirectly connected) with the first terminal 202 of the voltage stabilizing circuit, and the first voltage is provided by the main circuit 100 without an additional first voltage generation circuit to generate the first voltage, which effectively utilizes the existing resources, saves the cost, and is more beneficial to the miniaturization of the memory chip.

In some examples, as shown in FIG. 9, the main circuit 100 comprises:

an operational amplifier circuit 210, wherein a first terminal 211 of the operational amplifier circuit 210 is configured to receive the reference voltage, and provide a bias voltage to a current regulating circuit 220; and the current regulating circuit 220 coupled to the operational amplifier circuit 210 and configured to output the bias current from a first terminal 103 of the current regulating circuit 220 based on the bias voltage and the second voltage.

In an example, the first terminal 211 of the operational amplifier circuit 210 may be the first terminal 101 of the main circuit and is configured to receive the reference voltage; a second terminal 212 of the operational amplifier circuit 210 and a third terminal 222 of the current regulating circuit 220 are connected to the second terminal 203 of the voltage stabilizing circuit; and an output terminal 213 of the operational amplifier circuit 210 is connected to a second terminal 221 of the current regulating circuit 220;

the operational amplifier circuit 210 is configured to provide the bias voltage to the current regulating circuit 220, and the current regulating circuit 220 is configured to output the bias current from the first terminal 103 of the current regulating circuit 220 based on the bias voltage and the second voltage.

In some examples, the operational amplifier circuit 210 may include, but is not limited to, a proportional operational amplifier, an additive operational amplifier, a subtractive operational amplifier and a combination thereof. The operational amplifier 210 receives the reference voltage and outputs the bias voltage, wherein the bias voltage=g (the reference voltage).

In the examples of the present disclosure, by changing the type of the operational amplifier in the operational amplifier circuit 210 and changing the type and size of an internal device (including, but not limited to, a transistor and a resistor) of the operational amplifier, different bias voltages can be obtained, thereby changing the magnitude of the final bias current.

Figure 10B:
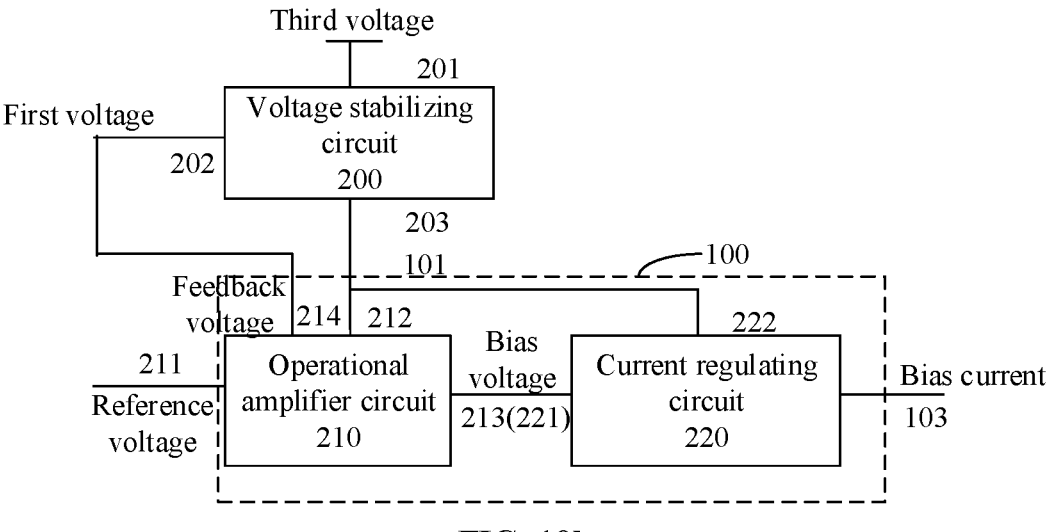

In some examples, as shown in FIG. 10$a$, the first terminal 202 of the voltage stabilizing circuit is connected to the first terminal 211 of the operational amplifier circuit, wherein the first voltage is equal to the reference voltage; or as shown in FIG. 10$b$, the first terminal 202 of the voltage stabilizing circuit is connected to a feedback terminal 214 of the operational amplifier circuit, wherein the first voltage is equal to the feedback voltage of the feedback terminal 214 of the operational amplifier circuit.

In the examples of the present disclosure, the feedback terminal 214 of the operational amplifier circuit may be the above-mentioned first node of the main circuit.

In the examples of the present disclosure, the first terminal 211 of the operational amplifier circuit and the feedback terminal 214 of the operational amplifier circuit may be regarded as being "virtually-shorted", so the voltages at the first terminal 211 of the operational amplifier circuit and the feedback terminal 214 of the operational amplifier circuit 210 are the same.

It may be understood that, since the switching state of the high-speed main circuit 100 (the switch in the main circuit 100 is not shown) affects the reference voltage of the first terminal 211 of the operational amplifier circuit, and in turn, affects the stability of the first voltage, in the examples of the present disclosure, the first voltage 202 of the voltage stabilizing circuit is connected to the feedback terminal 214 of the operational amplifier circuit, and the feedback voltage of the feedback terminal 214 of the operational amplifier circuit is more stable than the reference voltage of the first terminal 211 of the operational amplifier circuit, such that the first voltage received by the voltage stabilizing circuit 200 is more stable.

In some examples, the operational amplifier circuit 210 may comprise one or more operational amplifiers, an output terminal of a previous stage operational amplifier may serve as an input terminal of a next stage operational amplifier to achieve multi-stage amplification, so as to improve the operational amplification capability of the operational amplifier circuit 210.

Figure 11:
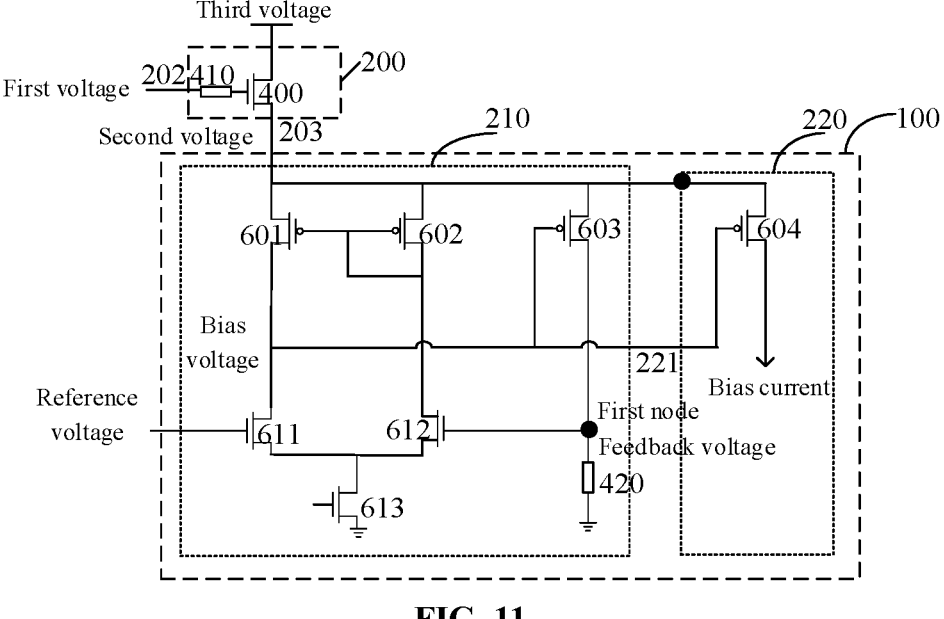

In some examples, as shown in FIG. 11, the operational amplifier circuit 210 comprises a first P-type transistor 601, a second P-type transistor 602, a first N-type transistor 611, a second N-type transistor 612, a third P-type transistor 603 and a second resistor 420;

a gate terminal of the first P-type transistor 601 is connected to a gate terminal of the second P-type transistor 602; a first terminal of the first P-type transistor 601, a first terminal of the second P-type transistor 602 and a first terminal of the third P-type transistor 603 are connected to the second terminal 203 of the voltage stabilizing circuit; the gate terminal of the second P-type transistor 602 is connected to a second terminal of the second P-type transistor 602; a first terminal of the first N-type transistor 611, a second terminal of the first P-type transistor 601 and a gate terminal of the third P-type transistor 603 are connected to the second terminal 221 of the current regulating circuit; a first terminal of the second N-type transistor 612 is connected to the second terminal of the second P-type transistor 602; a gate terminal of the first N-type transistor 611 is configured to receive the reference voltage; a gate terminal of the second N-type transistor 612 and a first terminal of the second resistor 420 are connected to a second terminal of the third P-type transistor 603; a second terminal of the second resistor 420 is connected to a ground terminal; and a second terminal of the first N-type transistor 611 and a second terminal of the second N-type transistor 612 are connected to a first terminal of a third N-type transistor 613 and connected to the ground terminal.

In the examples of the present disclosure, a third N-type transistor 613 may be also included, and the first N-type transistor 611 and the second N-type transistor 612 may be grounded through the third N-type transistor 613.

In the examples of the present disclosure, the first terminal of each transistor may be a source or a drain, and the second terminal of each transistor may be a drain or a source. For example, when the first terminal of the first P-type transistor 601 is a drain, the second terminal of the first P-type transistor 601 is a source. For another example, when the first terminal of the first P-type transistor 601 is a source, the second terminal of the first P-type transistor 601 is a drain.

In the examples of the present disclosure, the feedback terminal of the operational amplifier circuit 210 and the first terminal of the operational amplifier circuit 210 are "virtually-shorted", and the feedback voltage of the feedback terminal of the operational amplifier circuit 210 is equal to the reference voltage of the first terminal of the operational amplifier circuit 210. It is to be noted that, due to the reasons such as coupling capacitance inside the main circuit or internal voltage fluctuations of the main circuit caused by external interference, etc., the feedback voltage here is not necessarily completely equal to the reference voltage, but is approximately equal to the reference voltage. In an ideal case, the feedback voltage is equal to the reference voltage. There is the second resistor 420 between the feedback terminal and the ground terminal, so the current on the second resistor 420 is equal to the reference voltage/a resistance value of the second resistor 420. Since the third P-type transistor 603 and the second resistor 420 are located on the same branch, the current on the third P-type transistor 603 and the current on the second resistor 420 are the same, such that magnitude of a gate terminal voltage of the third P-type transistor 603 and magnitude of the bias voltage output by a first stage operational amplification module can be determined.

In some examples, the second resistor 420 may be a variable resistor, and the current on the third P-type transistor 603 may be changed by changing the resistance value of the second resistor 420.

In some examples, the gate terminal of the first transistor 400 may be connected to the gate terminal of the first N-type transistor 611. In some other examples, the gate terminal of the first transistor may be connected to the gate terminal of the second N-type transistor 612. Here, the gate terminal of the first transistor 400 may be directly connected to the gate terminal of the second N-type transistor 612, or the gate terminal of the first transistor 400 is connected to the first resistor 410, and is indirectly connected to the gate terminal of the second N-type transistor 612. In an example, both the second terminal of the first resistor 410 and the gate terminal of the second N-type transistor 612 are connected to the first node, and the voltage at the first node is the feedback voltage. In the examples of the present disclosure, parameters of the first N-type transistor 611 and the second N-type transistor 612 are identical, and parameters of the first P-type transistor and the second P-type transistor are identical. After the circuit is stabilized, the feedback voltage at the first node is equal to the reference voltage received by the gate terminal of the first N-type transistor 611.

In the examples of the present disclosure, the gate terminal of the first transistor is connected to the gate terminal of the second N-type transistor 612, which can effectively avoid the influence of the switching state of the high-speed main circuit 100 (the switch in the main circuit 100 is not shown) on the reference voltage at the gate terminal of the first N-type transistor 611. Since the feedback voltage at the gate terminal of the second N-type transistor 612 is more stable than the reference voltage at the gate terminal of the first N-type transistor 611, the first voltage received by the voltage stabilizing circuit is more stable, which, in turn, enables the second voltage received by the first terminal of the main circuit 100 to be more stable.

In some examples, as shown in FIG. 11, the current regulating circuit comprises a second transistor 604;

a first terminal of the second transistor 604 is connected to the second terminal 203 of the voltage stabilizing circuit, a gate terminal of the second transistor 604 is connected to the output terminal of the operational amplifier circuit 210, and a second terminal of the second transistor 604 is configured to output the bias current.

In some examples, the second transistor 604 may be a P-type transistor.

In some examples, the second transistor 604 may be a transistor identical to the third P-type transistor 603. Here the identical transistor may refer to that the second transistor 604 and the third P-type transistor 603 may be transistors of the same batch, or specifications and fabrication processes of the second transistor 604 and the third P-type transistor 603 are identical.

When the second transistor 604 is identical to the third P-type transistor 603, the second transistor 604 may "copy" the current on the third P-type transistor 603, that is, the magnitude of the bias current output by the second terminal of the second transistor 604 is equal to the current of the second terminal of the third P-type transistor 603.

In some other examples, a channel width and a channel length of the third P-type transistor 603 are M1 and L1, and a channel width and a channel length of the second transistor 604 are M2 and L2, such that the magnitude of the bias current output by the second terminal of the second transistor 604 is equal to the current of the second terminal of the third P-type transistor 603 times (M2/L2)/(M1/L1). In some examples, the channel length L1 of the third P-type transistor 603 may be the same as the channel length L2 of the second transistor 604, because there is good consistency between devices when the channel lengths are the same. Scaling of the current may be achieved by adjusting the channel widths between different transistors, so as to output a target bias current.

In some examples, the current regulating circuit 220 may comprise N P-type transistors in series, and the P-type transistors here may be the same transistors as the third P-type transistor. It may be understood that, the N P-type transistors in series are equivalent to amplifying the current on the third P-type transistor 603 by N times. N is an integer greater than 1.

Figure 12:
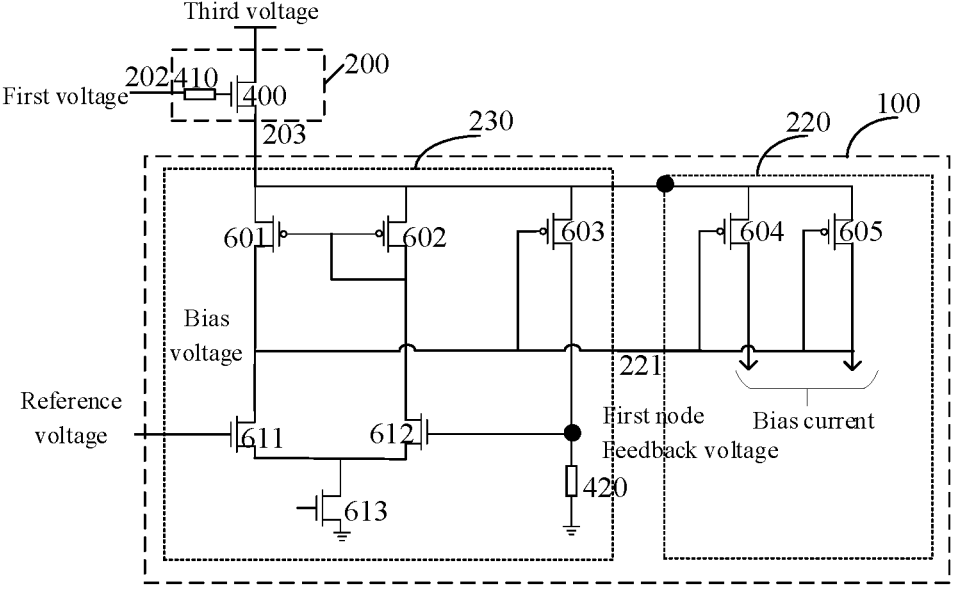

In some examples, as shown in FIG. 12, the current regulating circuit 220 not only comprises a first branch where the second transistor 604 is located, but also comprises a second branch where the fifth P-type transistor 605 is located, and a channel length L3 of the fifth P-type transistor 605 may be different from the channel length L2 of the second transistor 604. Alternatively, the fifth P-type transistor 605 comprises M P-type transistors in series. It may be understood that, the P-type transistors here may be the same transistors as the third P-type transistor. M is an integer greater than 1, and is different from N.

As such, a designated target bias current may be output by selectively turning on the transistors on a designated branch of the current regulating circuit 220.

In the examples of the present disclosure, a plurality of branches are disposed on the current regulating circuit 220, and the adjustable range of the bias current is enlarged.

Figure 13:
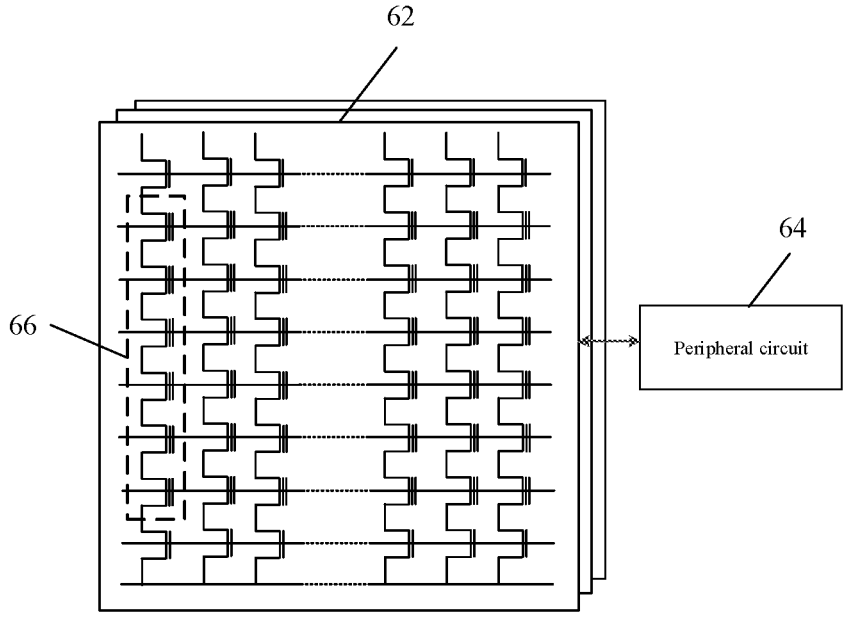
FIG. 13 is a schematic structural diagram I of a memory device comprising a memory cell array and a peripheral circuit provided by examples of the present disclosure.

Examples of the present disclosure further provide a memory device which, as shown in FIG. 13, comprises a memory cell array 62 and a peripheral circuit 64 coupled with the memory cell array 62, wherein the peripheral circuit 64 comprises a current bias circuit of any one of the above examples.

The memory device 60 may comprise the memory cell array 62 and the peripheral circuit 64 coupled to the memory cell array 62, etc. Here, the memory cell array may be a NAND flash memory cell array in which memory cells are disposed in a form of an array of NAND memory strings 66 each extending vertically above a substrate. In some examples, each NAND memory string 66 may comprise a plurality of memory cells that are coupled in series and stacked vertically. Each memory cell may hold a continuous analog value, such as a value of voltage or charge, which depends on the number of electrons trapped within a region of the memory cell. In addition, each memory cell in the above-mentioned memory cell array 62 may be either a floating gate type memory cell that includes a floating gate transistor, or a charge trapping type memory cell that includes a charge trapping transistor.

In an example of the present disclosure, the memory cell may be a Single Level Cell (SLC) that has two possible memory states and thus can store one bit of data. For example, the first memory state "0" may correspond to a first threshold voltage range, and the second memory state "1" may correspond to a second threshold voltage range. In some other examples, each memory cell may be a Multi Level Cell (MLC) that is capable of storing more than a single bit of data in more than four memory states. For example, the MLC may store two bits per cell, three bits per cell (also known as a Triple Level Cell (TLC)), or four bits per cell (also known as a Quad Level Cell (QLC)). Each MLC may be programmed to assume a range of possible nominal storage values. In an example, if each MLC stores two bits of data, the MLC may be programmed to write one of three possible nominal storage values to the memory cell, such that the memory cell is programmed from an erased state to one of three possible programming levels. A fourth nominal storage value may be used for the erased state.

Figure 14:
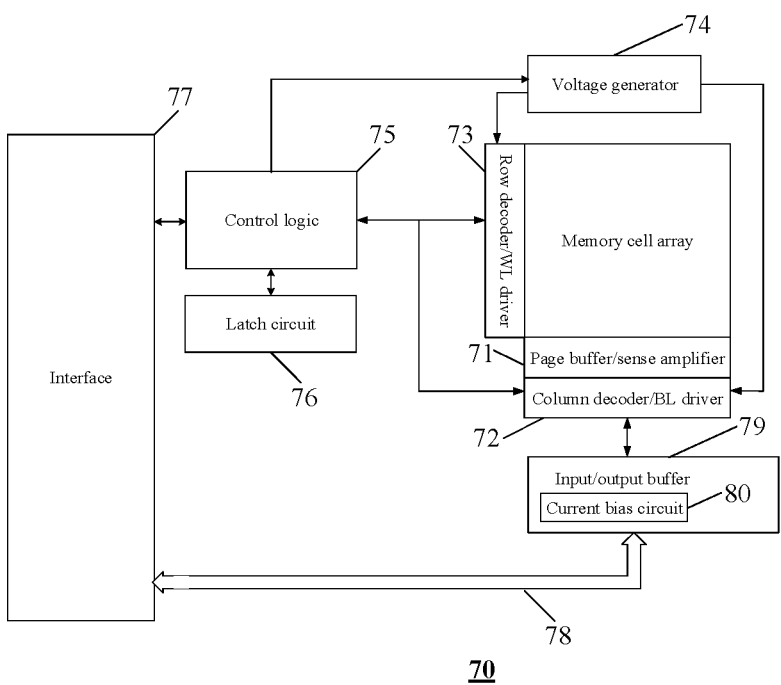
FIG. 14 is a schematic structural diagram II of a memory device comprising a memory cell array and a peripheral circuit provided by examples of the present disclosure.

In the examples of the present disclosure, the above-mentioned peripheral circuit may be coupled to the memory cell array through a Bit Line (BL), a Word Line (WL), a Source Line, a Source Select Gate (SSG) and a Drain Select Gate (DSG). Here, the peripheral circuit may include any suitable analog, digital, and hybrid signal circuits for facilitating relevant operations of the memory cell array by applying and sensing voltage signals and/or current signals to and from each target memory cell via the bit line, the word line, the source line, the SSG, or the DSG, etc. Furthermore, the peripheral circuit may further include various types of peripheral circuits formed using a Metal-Oxide-Semiconductor (MOS) technology. In an example, as shown in FIG. 14, the peripheral circuit 70 may comprise a page buffer (PB)/sense amplifier 71, a column decoder/bit line driver 72, a row decoder/word line driver 73, a voltage generator 74, a control logic 75, a latch circuit 76, an interface 77 and a data bus 78, as well as an input/output buffer 79, wherein the input/output buffer 79 comprises the current bias circuit 80. It should be understood that the above-mentioned peripheral circuit 70 may be the same as the peripheral circuit 64 in FIG. 13, and in some other examples, the peripheral circuit 70 may further comprise additional peripheral circuits not shown in FIG. 14. An I/O system in the examples of the present disclosure may comprise the interface 77 and the input/output buffer 79. The I/O system is configured to transmit data and commands between an external host and the memory cell array.

The page buffer/sense amplifier 71 may be configured to read and program (write) data from and to the memory cell array according to control signals from the control logic 75. The column decoder/bit line driver 72 may be configured to be controlled by the control logic 75 and select one or more memory strings by applying bit line voltages generated from the voltage generator 74. The row decoder/word line driver 73 may be configured to be controlled by the control logic 75 and select/unselect memory blocks of the memory cell array and select/unselect word lines of the memory blocks. The row decoder/word line driver 73 may be further configured to drive word lines by using word line voltages generated from the voltage generator 74. The voltage generator 74 may be configured to be controlled by the control logic 75 and generate a word line voltage (e.g., a read voltage, a program voltage, a pass voltage, a local voltage, a verify voltage, etc.), a bit line voltage and a source line voltage to be supplied to the memory cell array. The control logic 75 may be coupled to each peripheral circuit described above and configured to control the operations of each peripheral circuit. The latch circuit 76 may be coupled to the control logic 75 and include a state register, a command register, and an address register for storing state information, command operation codes (OP codes), and command addresses for controlling the operations of each peripheral circuit. The interface 77 may be coupled to the control logic 75, and act as a control buffer to buffer and relay control commands received from a host (not shown) to the control logic 75 and state information received from the control logic 75 to the host. The input/output buffer 79 may be coupled with the column decoder/bit line driver 72, and coupled to the interface 77 via the data bus 78 for buffering input/output data. In the examples of the present disclosure, the input/output buffer 79 may be connected to the interface 77, and the input/output buffer 79 interacts with the external host through the interface 77, including: outputting data in the memory cell array to the external host, or storing data transmitted by the external host in the memory cell array. In an example, the data may be read from the memory cell array, and the data read out may be buffered in the page buffer, output to the input/output buffer 79 through the page buffer, then output to the interface 77 through the input/output buffer 79, and further output to the external host. The input/output buffer 79 needs a stable bias voltage to input/output the data stably. The input/output buffer 79 in the examples of the present disclosure comprises the current bias circuit 80 that provides a stable bias current to the input/output buffer 79, and then provides a stable bias voltage to the input/output buffer 79 through a current-voltage conversion circuit, such that the data can be input or output stably.

It should be understood that, the current bias circuit in the examples of the present disclosure is not limited to be applied in the input/output buffer 79 in peripheral circuit. Any component in the peripheral circuit that needs a stable bias current may employ the current bias circuit provided by the present disclosure, for example, the current bias circuit may be also applied in a verify failbit count (VFC) circuit.

Figure 15:
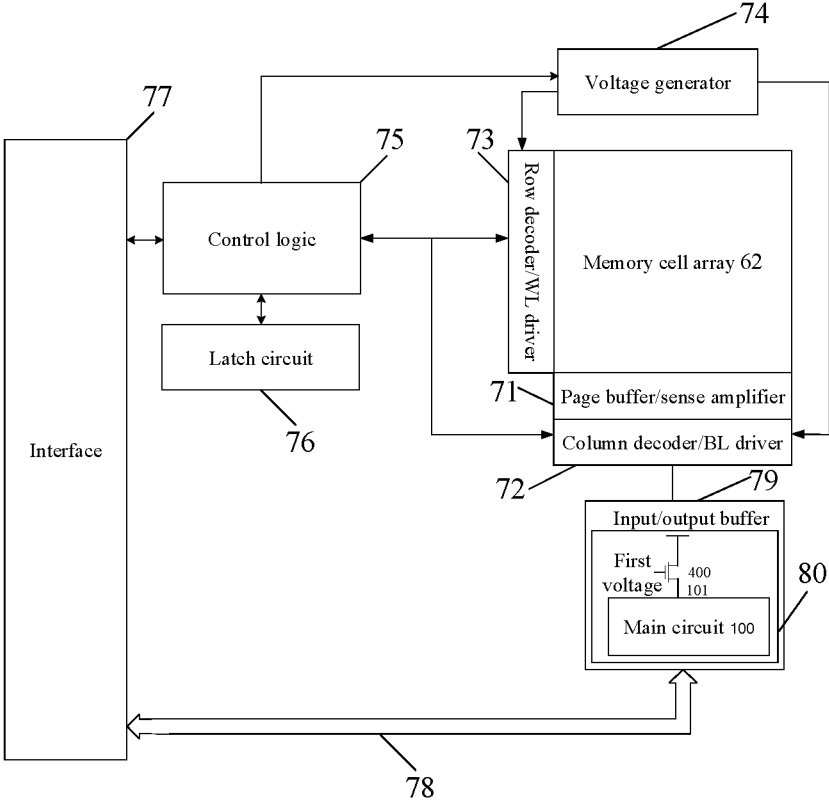
FIG. 15 is a schematic structural diagram III of a memory device comprising a memory cell array and a peripheral circuit provided by examples of the present disclosure.

Examples of the present disclosure further provide another memory device that, as shown in FIG. 15, comprises a memory cell array 62, and a peripheral circuit 70 coupled with the memory cell array 62, wherein the peripheral circuit 70 comprises:

a first transistor 400 configured to output a second voltage through a first terminal of the first transistor 400 based on a first voltage received by a gate terminal of the first transistor 400; and a main circuit 100, wherein a first terminal 101 of the main circuit is coupled to the first terminal of the first transistor 400, and the main circuit 100 is configured to generate a bias current based on the second voltage output by the first terminal of the first transistor 400.

In an example, the gate terminal of the first transistor 400 is configured to receive the first voltage, and the first terminal of the first transistor 400 is connected to the first terminal 101 of the main circuit 100. The first transistor 400 is configured to provide the second voltage to the first terminal 101 of the main circuit based on the first voltage. The main circuit 100 is configured to generate the bias current based on the second voltage.

A second terminal of the first transistor 400 is connected to an external power supply, and the first voltage received by the gate terminal of the first transistor 400 is less than a third voltage provided by the external power supply, which can ensure that the first transistor 400 is in a just turned-on state, such that a clamping effect may be achieved by the first transistor 400. In this case, a voltage at the first terminal of the first transistor 400, i.e., the second voltage, is equal to the first voltage minus a threshold voltage of the first transistor 400.

The first transistor 400 includes, but is not limited to, an enhanced N-type transistor and a depletion N-type transistor.

In the examples of the present disclosure, the peripheral circuit 70 comprises an input/output buffer 79 that comprises a current bias circuit 80. The current bias circuit 80 comprises the first transistor 400 and the main circuit 100. The current bias circuit 80 may provide a stable bias current to the input/output buffer 79, and then may provide a bias voltage to the input/output buffer through a current-voltage conversion circuit in the input/output buffer. It may be understood that the first transistor 400 and the main circuit 100 may also provide a stable bias current to other circuits in the peripheral circuit that requires the bias current.

In the examples of the present disclosure, the second voltage required by the main circuit is mainly determined by the first voltage and the threshold voltage of the first transistor 400, thereby filtering a power supply noise on the third voltage, such that the bias current provided by the first transistor 400 and the main circuit 100 is stable. Moreover, the area of the memory chip occupied by the first transistor 400 is very small, which effectively saves the area of the memory chip and is beneficial to the miniaturization of the memory chip.

In some examples, the peripheral circuit further comprises a first resistor, wherein a first terminal of the first resistor is connected to a gate terminal of the first transistor.

In some examples, a second terminal of the first resistor is configured to receive the first voltage, and the first terminal of the first resistor is connected to the gate terminal of the first transistor, so as to transfer the first voltage to the gate terminal of the first transistor.

According to the examples of the present disclosure, the first resistor is disposed at the second terminal of a clamp circuit, which compensates loss in loop stability caused by parasitic capacitance and improves the stability of the circuit.

In some examples, the first transistor comprises a depletion N-type transistor.

In some examples, the main circuit is configured to generate a feedback voltage at a first node of the main circuit based on a reference voltage received by a second terminal of the main circuit, wherein the feedback voltage is equal to the reference voltage; and a second terminal of the first resistor is connected to the first node of the main circuit.

In some examples, the main circuit comprises a first P-type transistor, a second P-type transistor, a first N-type transistor, a second N-type transistor, a third P-type transistor, a second resistor and a second transistor;

a gate terminal of the first P-type transistor is connected to a gate terminal of the second P-type transistor; a first terminal of the first P-type transistor, a first terminal of the second P-type transistor, a first terminal of the third P-type transistor and a first terminal of the second transistor are connected to the first terminal of the first transistor; the gate terminal of the second P-type transistor is connected to a second terminal of the second P-type transistor; a first terminal of the first N-type transistor, a second terminal of the first P-type transistor and a gate terminal of the third P-type transistor are connected to a gate terminal of the second transistor; a first terminal of the second N-type transistor is connected to the second terminal of the second P-type transistor; a gate terminal of the first N-type transistor is configured to receive a reference voltage; a gate terminal of the second N-type transistor and a first terminal of the second resistor are connected to a second terminal of the third P-type transistor; a second terminal of the second resistor is connected to a ground terminal; a second terminal of the first N-type transistor and a second terminal of the second N-type transistor are connected to the ground terminal; and a second terminal of the second transistor outputs the bias current.

In some examples, the main circuit is further configured to provide the first voltage to the gate terminal of the first transistor. The gate terminal of the first N-type transistor is connected to the gate terminal of the first transistor, or the gate terminal of the second N-type transistor is connected to the gate terminal of the first transistor.

Since the gate terminal of the first N-type transistor and the gate terminal of the second N-type transistor are "virtually-shorted", a voltage at the gate terminal of the second N-type transistor follows a voltage at the gate terminal of the first N-type transistor. In the examples of the present disclosure, the voltage of the gate terminal of the first N-type transistor may be a reference voltage.

As such, the first voltage received by the first transistor is from the main circuit, without an additional first voltage generation circuit to generate the first voltage, which is more beneficial to the miniaturization of the memory chip.

In some examples, the gate terminal of the first transistor is connected to the gate terminal of the second N-type transistor, which can effectively avoid the influence of the switching state of the high-speed main circuit (the switch in the main circuit not shown) on the reference voltage at the gate terminal of the first N-type transistor. The feedback voltage at the gate terminal of the second N-type transistor is more stable than the reference voltage at the gate terminal of the first N-type transistor, such that the first voltage received by the voltage stabilizing circuit is more stable.

In some examples, the memory device provided by the examples of the present disclosure includes, but is not limited to, a two-dimensional memory (e.g., a two-dimensional NAND memory), and a three-dimensional memory (e.g., a three-dimensional NAND memory). The type of the memory device includes, but is not limited to, a flash memory, a ferroelectric random access memory, a magnetic random access memory, a phase change random access memory and a resistive random access memory.

Examples of the present disclosure further provide a memory system comprising a memory device of any one of the above examples, and a memory controller that is coupled with the memory device and controls the memory device.

In some examples, the memory system includes, but is not limited to, a memory card or a solid state drive (SSD).

The memory device and the memory system are further illustrated below in conjunction with the drawings.

Figure 16:
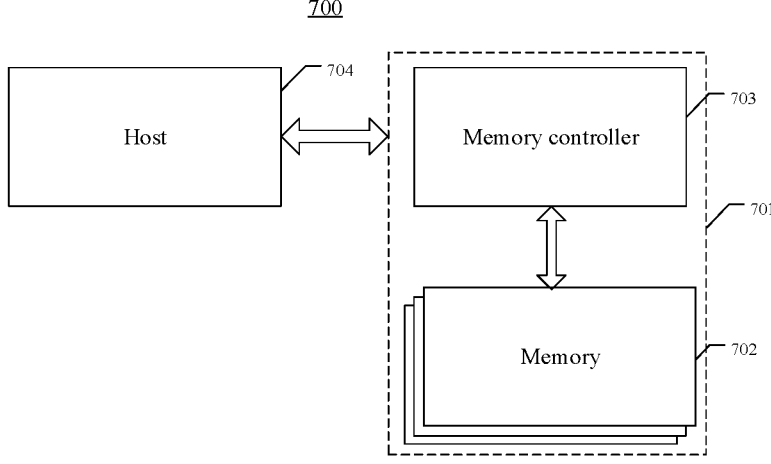
FIG. 16 is a schematic diagram of an example system having a memory system provided by examples of the present disclosure.

As shown in FIG. 16, the system 700 may be a mobile phone, a desktop computer, a laptop computer, a tablet computer, a vehicle computer, a game console, a printer, a positioning apparatus, a wearable electronic apparatus, a smart sensor, a Virtual Reality (VR) apparatus, an Augmented Reality (AR) apparatus or any other suitable electronic apparatuses having memories therein. The system 700 may comprise a host 704 and a memory system 701, wherein the memory system 701 has one or more memories 702 and a memory controller 703. The host 704 may be a processor (for example, a Central Processing Unit (CPU)) or a System on a Chip (SoC) (for example, an Application Processor (AP)) of an electronic apparatus. The host 704 may be configured to send or receive data to or from the memories 702.

Figure 17:
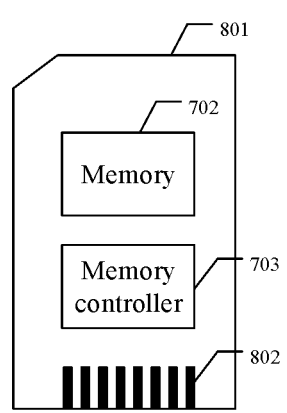
FIG. 17 is a schematic diagram of an example memory card having a memory system provided by examples of the present disclosure.
Figure 18:
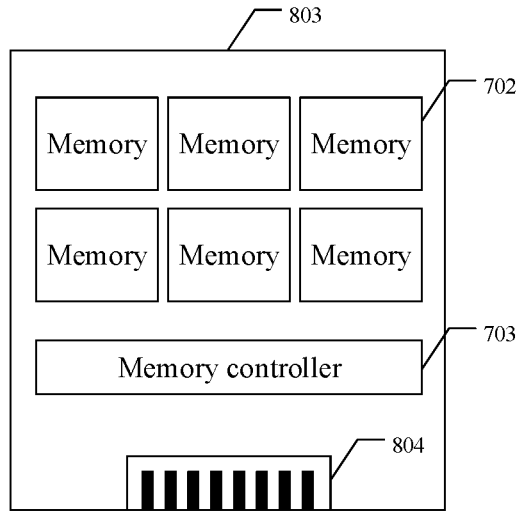
FIG. 18 is a schematic diagram of an example solid state drive having a memory system according to examples of the present disclosure.

The memory controller 703 and one or more memories 702 can be integrated into various types of storage apparatuses, for example, be included in the same package, such as a Universal Flash Storage (UFS) package or an embedded multi-media-card package. That is to say, the memory system 701 can be implemented and packaged into different types of end electronic products. In one example as shown in FIG. 17, the memory controller 703 and a single memory device 702 may be integrated into a memory card 801. The memory card 801 may include a Personal Computer Memory Card International Association (PC) card, a CF card, a Smart Media (SM) card, a memory stick, a Multi-Media Card (MMC, Reduced-Size MMC (RS-MMC), and MMCmicro), an SD card (SD, miniSD, microSD, Secure Digital High Capacity (SDHC)), a UFS, etc. The memory card 801 may further comprise a memory card connector 802 coupling the memory card 801 with a host. In another example as shown in FIG. 18, the memory controller 703, and multiple memories 702 may be integrated into an SSD 803. The SSD 803 may further comprise an SSD connector 804 coupling the SSD 803 with the host.

It is to be understood that, references to "one example" or "an example" throughout this specification mean that particular features, structures, or characteristics related to the example are included in at least one example of the present disclosure. Therefore, "in one example" or "in an example" presented everywhere throughout this specification does not necessarily refer to the same example. Furthermore, these particular features, structures, or characteristics may be incorporated in one or more examples in any suitable manner. It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure. The above sequence numbers of the examples of the present disclosure are only for description, and do not represent advantages or disadvantages of the examples.

It is to be noted that, the terms "comprise", "include" or any variants thereof herein are intended to cover non-exclusive inclusion, such that a process, a method, an article or a device comprising a series of elements comprise not only those elements, but also other elements not listed explicitly, or elements inherent to this process, method, article or device. An element defined by a statement "comprising one" do not preclude the presence of another identical element in the process, method, article or device comprising this element, without more limitations.

The above descriptions are merely implementations of the present disclosure, and the protection scope of the present disclosure is not limited to these. Any variation or replacement that may be readily figured out by those skilled in the art within the technical scope disclosed by the present disclosure shall fall within the protection scope of the present disclosure. Therefore, the protection scope of the present disclosure shall be defined by the protection scope of the claims.

What is claimed is:

1. A current bias circuit, comprising:
a voltage stabilizing circuit configured to output a second voltage through a second terminal of the voltage stabilizing circuit based on a first voltage received by a first terminal of the voltage stabilizing circuit, wherein a third terminal of the voltage stabilizing circuit is configured to receive a third voltage greater than the first voltage, and the voltage stabilizing circuit comprises a clamp circuit comprising a depletion N-type transistor; and
a main circuit comprising a first terminal coupled to the second terminal of the voltage stabilizing circuit, and the main circuit is configured to receive the second voltage output by the second terminal of the voltage stabilizing circuit to generate a bias current.

2. The current bias circuit of claim 1, wherein the voltage stabilizing circuit comprises a clamp circuit configured to provide the second voltage to the first terminal of the main circuit based on the first voltage and a voltage drop of the clamp circuit.

3. The current bias circuit of claim 2, wherein the clamp circuit comprises a first transistor, and the clamp circuit is configured to provide the second voltage to the first terminal of the main circuit based on the first voltage and a threshold voltage of the first transistor.

4. The current bias circuit of claim 2, wherein the voltage stabilizing circuit further comprises a first resistor coupled to the clamp circuit.

5. The current bias circuit of claim 4, wherein a resistance value of the first resistor is related to magnitude of loss in loop stability caused by parasitic capacitance of the voltage stabilizing circuit.

6. The current bias circuit of claim 4, wherein a resistance value of the first resistor is greater than or equal to 1 kΩ, and less than or equal to 100 kΩ.

7. The current bias circuit of claim 1, wherein the main circuit is configured to provide the first voltage to the first terminal of the voltage stabilizing circuit based on a reference voltage received by a second terminal of the main circuit.

8. The current bias circuit of claim 1, wherein the main circuit is configured to generate a feedback voltage at a first node of the main circuit based on a reference voltage received by a second terminal of the main circuit, wherein the feedback voltage is equal to the reference voltage; and the first node of the main circuit is connected to the first terminal of the voltage stabilizing circuit.

9. The current bias circuit of claim 7, wherein the main circuit comprises:
an operational amplifier circuit, wherein a first terminal of the operational amplifier circuit is configured to receive the reference voltage, and provide a bias voltage to a current regulating circuit; and the current regulating circuit coupled to the operational amplifier circuit and configured to output the bias current from a first terminal of the current regulating circuit based on the bias voltage and the second voltage.

10. The current bias circuit of claim 9, wherein the first terminal of the voltage stabilizing circuit is connected to a second terminal of the operational amplifier circuit; or the first terminal of the voltage stabilizing circuit is connected to a feedback terminal of the operational amplifier circuit.

11. The current bias circuit of claim 9, wherein the operational amplifier circuit comprises a first P-type transistor, a second P-type transistor, a first N-type transistor, a second N-type transistor, a third N-type transistor, a third P-type transistor and a second resistor;
a gate terminal of the first P-type transistor is connected to a gate terminal of the second P-type transistor; a first terminal of the first P-type transistor, a first terminal of the second P-type transistor and a first terminal of the third P-type transistor are connected to the second terminal of the voltage stabilizing circuit; the gate terminal of the second P-type transistor is connected to a second terminal of the second P-type transistor; a first terminal of the first N-type transistor, a second terminal of the first P-type transistor and a gate terminal of the third P-type transistor are connected to a second terminal of the current regulating circuit; a first terminal of the second N-type transistor is connected to the second terminal of the second P-type transistor; a gate terminal of the first N-type transistor is configured to receive the reference voltage; a gate terminal of the second N-type transistor and a first terminal of the second resistor are connected to a second terminal of the third P-type transistor; a second terminal of the second resistor is connected to a ground terminal; a second terminal of the first N-type transistor and a second terminal of the second N-type transistor are connected to a first terminal of the third N-type transistor; and a second terminal of the third N-type transistor is connected to the ground terminal.

12. The current bias circuit of claim 9, wherein the current regulating circuit comprises a second transistor; and wherein a first terminal of the second transistor is connected to the second terminal of the voltage stabilizing circuit, a gate terminal of the second transistor is connected to an output terminal of the operational amplifier circuit, and a second terminal of the second transistor is configured to output the bias current.

13. A memory device, comprising:
a memory cell array, and
a peripheral circuit coupled with the memory cell array, wherein the peripheral circuit comprises a current bias circuit comprising:
a voltage stabilizing circuit configured to output a second voltage through a second terminal of the voltage stabilizing circuit based on a first voltage received by a first terminal of the voltage stabilizing circuit, wherein a third terminal of the voltage stabilizing circuit is configured to receive a third voltage greater than the first voltage, and the voltage stabilizing circuit comprises a clamp circuit comprising a depletion N-type transistor; and
a main circuit comprising a first terminal coupled to the second terminal of the voltage stabilizing circuit, and the main circuit is configured to receive the second voltage output by the second terminal of the voltage stabilizing circuit to generate a bias current.

14. The memory device of claim 13, wherein the voltage stabilizing circuit comprises a clamp circuit configured to provide the second voltage to the first terminal of the main circuit based on the first voltage and a voltage drop of the clamp circuit.

15. The memory device of claim 14, wherein the clamp circuit comprises a first transistor, and the clamp circuit is configured to provide the second voltage to the first terminal of the main circuit based on the first voltage and a threshold voltage of the first transistor.

16. The memory device of claim 13, wherein the voltage stabilizing circuit further comprises a first resistor coupled to the clamp circuit.

17. A memory device, comprising a memory cell array and a peripheral circuit coupled with the memory cell array, wherein the peripheral circuit comprises:

a first transistor configured to output a second voltage through a first terminal of the first transistor based on a first voltage received by a gate terminal of the first transistor, wherein a third terminal of the first transistor is configured to receive a third voltage greater than the first voltage, and the first transistor comprises a clamp circuit comprising a depletion N-type transistor; and a main circuit comprising a first terminal coupled to the first terminal of the first transistor, and the main circuit is configured to generate a bias current based on the second voltage output by the first terminal of the first transistor.

18. The memory device of claim 17, wherein the peripheral circuit further comprises a first resistor, wherein a first terminal of the first resistor is connected to the gate terminal of the first transistor.

19. The memory device of claim 18, wherein the main circuit is configured to generate a feedback voltage at a first node of the main circuit based on a reference voltage received by a second terminal of the main circuit, wherein the feedback voltage is equal to the reference voltage; and a second terminal of the first resistor is connected to the first node of the main circuit.

20. The memory device of claim 17, wherein the main circuit comprises a first P-type transistor, a second P-type transistor, a first N-type transistor, a second N-type transistor, a third P-type transistor, a second resistor and a second transistor;

a gate terminal of the first P-type transistor is connected to a gate terminal of the second P-type transistor; a first terminal of the first P-type transistor, a first terminal of the second P-type transistor, a first terminal of the third P-type transistor and a first terminal of the second transistor are connected to the first terminal of the first transistor; the gate terminal of the second P-type transistor is connected to a second terminal of the second P-type transistor; a first terminal of the first N-type transistor, a second terminal of the first P-type transistor and a gate terminal of the third P-type transistor are connected to a gate terminal of the second transistor; a first terminal of the second N-type transistor is connected to the second terminal of the second P-type transistor; a gate terminal of the first N-type transistor is configured to receive a reference voltage; a gate terminal of the second N-type transistor and a first terminal of the second resistor are connected to a second terminal of the third P-type transistor; a second terminal of the second resistor is connected to a ground terminal; a second terminal of the first N-type transistor and a second terminal of the second N-type transistor are connected to the ground terminal; and a second terminal of the second transistor outputs the bias current.

* * * * *